(12) United States Patent
Renault (10) Patent No.: US 10,301,173 B2
(45) Date of Patent: May 28, 2019

(54) RF MEMS ELECTRODES WITH LIMITED GRAIN GROWTH

(71) Applicant: CAVENDISH KINETICS, INC., San Jose, CA (US)

(72) Inventor: Mickael Renault, San Jose, CA (US)

(73) Assignee: CAVENDISH KINETICS, INC., San Jose, CA (US)

(*) Notice: Subject to any disclaimer, the term of this patent is extended or adjusted under 35 U.S.C. 154(b) by 0 days.

(21) Appl. No.: 14/914,071

(22) PCT Filed: Aug. 27, 2014

(86) PCT No.: PCT/US2014/052898
§ 371 (c)(1),
(2) Date: Feb. 24, 2016

(87) PCT Pub. No.: WO2015/031473
PCT Pub. Date: Mar. 5, 2015

(65) Prior Publication Data
US 2016/0200565 A1    Jul. 14, 2016

Related U.S. Application Data (60) Provisional application No. 61/870,840, filed on Aug. 28, 2013.

(51) Int. Cl.
*H01L 29/84* (2006.01)
*B81B 7/00* (2006.01)
(Continued)

(52) U.S. Cl.
CPC .......... *B81B 7/0006* (2013.01); *B81B 3/0078* (2013.01); *B81C 1/00095* (2013.01);
(Continued)

(58) Field of Classification Search
CPC ............ H01H 59/0009; H01H 1/0036; H01H 2001/0052; H01H 2001/008; H01G 5/18;
(Continued)

(56) References Cited

U.S. PATENT DOCUMENTS 4,962,060 A † 10/1990 Sliwa
5,285,099 A * 2/1994 Carruthers .......... H01L 23/5256
257/529
(Continued)

FOREIGN PATENT DOCUMENTS

CN          1202273 A     12/1998
CN        103155069 A      6/2013
(Continued)

OTHER PUBLICATIONS

Koller K et al: "Stress induced metallurgical effects in Ti/TiN/AlCu/TiN metal stacks", AIP Conference Proceedings, American Institute of Physics, New York, U.S. vol. 612, Apr. 1, 2002, pp. 235-246.
(Continued)

*Primary Examiner* — Vongsavanh Sengdara
(74) *Attorney, Agent, or Firm* — Patterson & Sheridan, LLP; Steven Versteeg (57) ABSTRACT

The present invention generally relates to an RF MEMS DVC and a method for manufacture thereof. To ensure that undesired grain growth does not occur and contribute to an uneven RF electrode, a multilayer stack comprising an AlCu layer and a layer containing titanium may be used. The titanium diffuses into the AlCu layer at higher temperatures such that the grain growth of the AlCu will be inhibited and the switching element can be fabricated with a consistent structure, which leads to a consistent, predictable capacitance during operation.

16 Claims, 6 Drawing Sheets

(51) Int. Cl.
  *B81B 3/00* (2006.01)
  *B81C 1/00* (2006.01)
  *H01G 5/18* (2006.01)
  *H01H 59/00* (2006.01)
  *H01H 1/00* (2006.01)

(52) U.S. Cl.
  CPC ............ *B81C 1/00341* (2013.01); *H01G 5/18* (2013.01); *H01H 59/0009* (2013.01); *B81B 2201/0221* (2013.01); *H01H 1/0036* (2013.01); *H01H 2001/0052* (2013.01); *H01H 2001/0084* (2013.01)

(58) Field of Classification Search
  CPC ............ B81C 1/00095; B81C 1/00341; B81B 7/0006; B81B 2201/0221
  USPC ........................................................ 257/415
  See application file for complete search history.

(56) References Cited

U.S. PATENT DOCUMENTS

| | | | |
|---|---|---|---|
| 5,747,879 A | 5/1998 | Rastogi et al. | |
| 2004/0145031 A1* | 7/2004 | Ito | H01L 24/11 257/642 |
| 2008/0124912 A1* | 5/2008 | Liu | H01L 21/28273 438/622 |
| 2009/0160022 A1* | 6/2009 | Yang | H01L 21/0206 257/532 |
| 2010/0116632 A1* | 5/2010 | Smith | B81B 7/04 200/181 |
| 2012/0068278 A1 | 3/2012 | Knipe et al. | |

FOREIGN PATENT DOCUMENTS

| | | |
|---|---|---|
| JP | H1197531 A | 4/1999 |
| WO | 9712391 A1 | 4/1997 |

OTHER PUBLICATIONS

Arthur T Kuo et al: "Reliability Study of TiN/AiCulMN Interconnect in Submicron CMOS Process", 1993 Mrs. Spring Meeting—Symposium M2—Materials Reliability in Microelectronics III, vol. 309, Dec. 31, 1993, pp. 149-154.
Puttlitz A F et al: "Semiconductor Interlevel Shorts Caused by Hillock Formation in Al—Cu Metallization", IEEE Transactions on Components, Hybrids and Manufacturing Technology, IEEE Inc. New York, U.S., vol. 12, No. 4, Dec. 1, 1989, pp. 619-626.
Chinese Office Action (with attached English translation) for Application No. 201480047864.7; dated Dec. 12, 2017; 36 total pages.
Chinese Office Action (with attached English translation) for Application No. 201480047864.7; dated May 26, 2017; 19 total pages.
Office Action issued in corresponding Chinese Patent Application No. 201480047864.7, dated May 28, 2018 (11 pages).
Natarajan et al., CMOS integrated digital RF MEMS capacitors, 2011 IEEE 11th Topical Meeting on Silicon Monolithic Integrated Circuits in RF Systems, Jan. 17-19, 2011.†
Licata et al., Interconnect fabrication processes and the development of low-cost wiring for CMOS products, IBM Journal of Research and Development, Jul. 1995, vol. 39, Issue 4, 419-435.†
Farahani et al., Evaluation of Titanium as a Diffusion Barrier Between Aluminum and Silicon for 1.2 μm CMOS Integrated Circuits, J. Electrochem. Soc., 1987, vol. 134, issue 11, 2835-2845.†
Class Notes on Aluminum Metallization in Interconnections from Stanford Course No. EE311 on Advanced Integrated Circuit Fabrication Processes, Spring 2003. Available at http://web.stanford.edu/class/ee311/NOTES/Interconnect_Al.pdf.†

\* cited by examiner
† cited by third party

RF MEMS ELECTRODES WITH LIMITED GRAIN GROWTH

BACKGROUND OF THE INVENTION

Field of the Invention

Embodiments of the present invention generally relate to a RF micro electromechanical system (MEMS) digital variable capacitor (DVC) and methods for manufacture thereof.

Description of the Related Art

Figure 1:
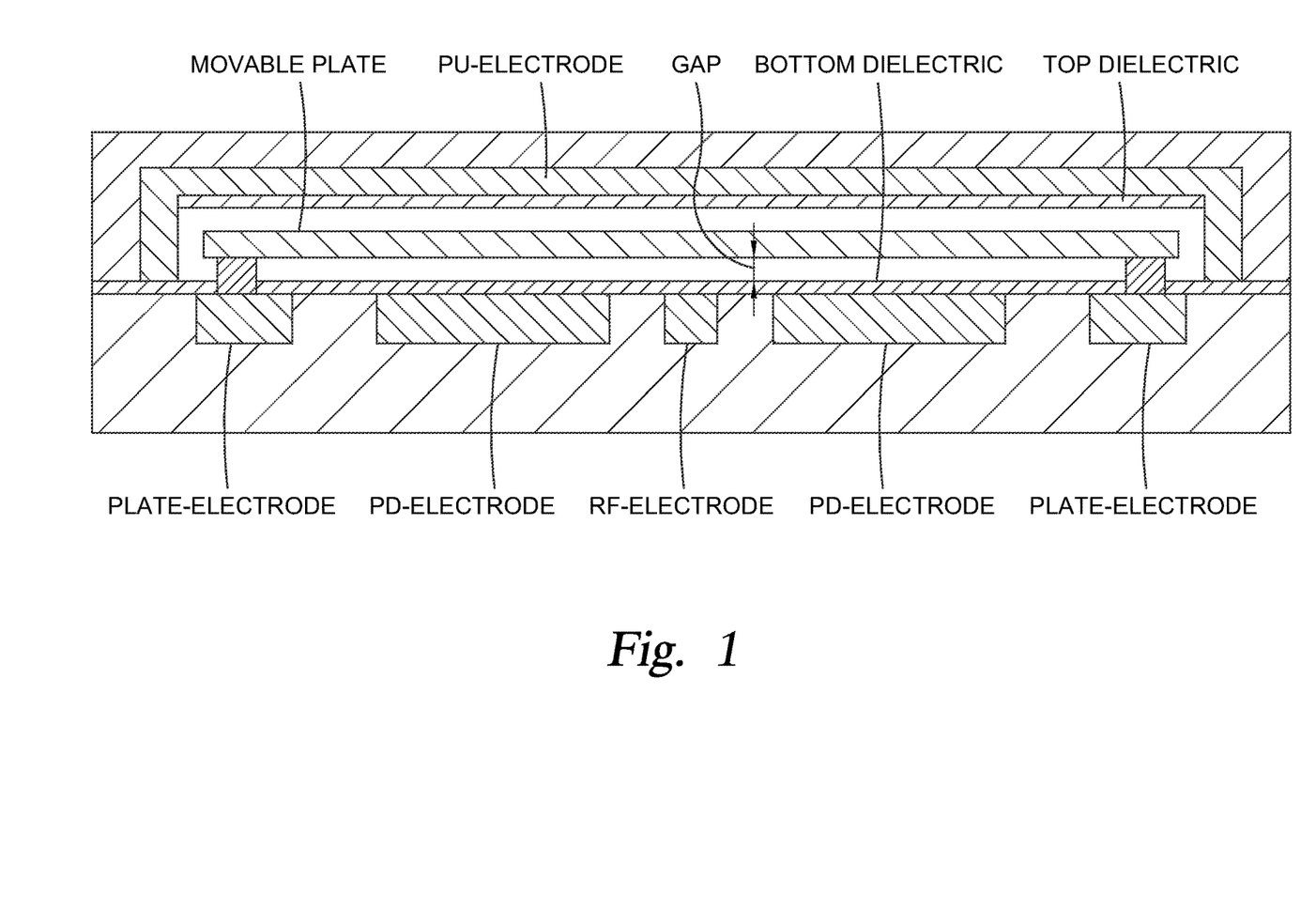
FIG. 1 is a schematic cross-section illustration of a MEMS DVC in the free-standing state.
Figure 2:
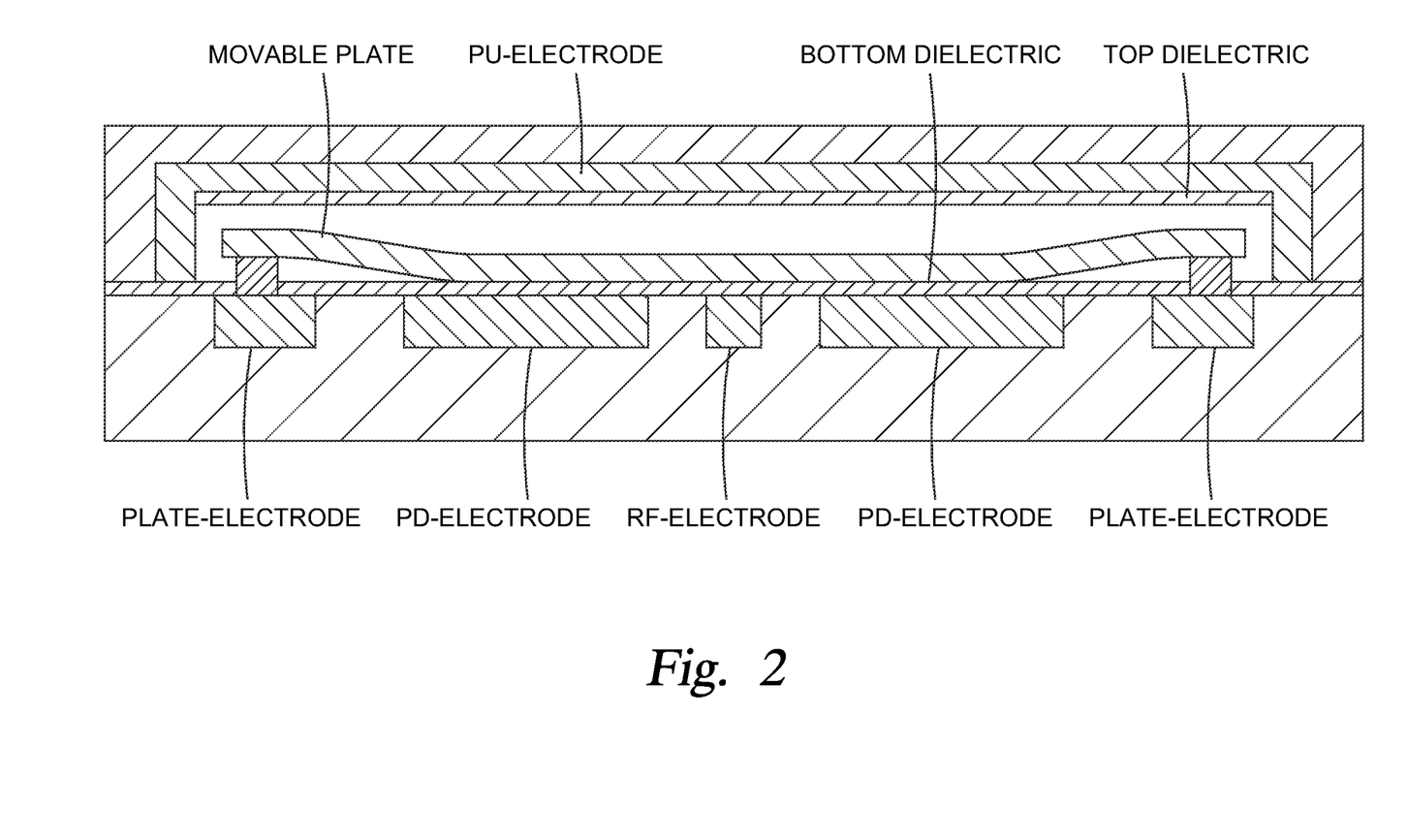
FIG. 2 is a schematic cross-section illustration of the MEMS DVC of FIG. 1 in the $C_{max}$ state.
Figure 3:
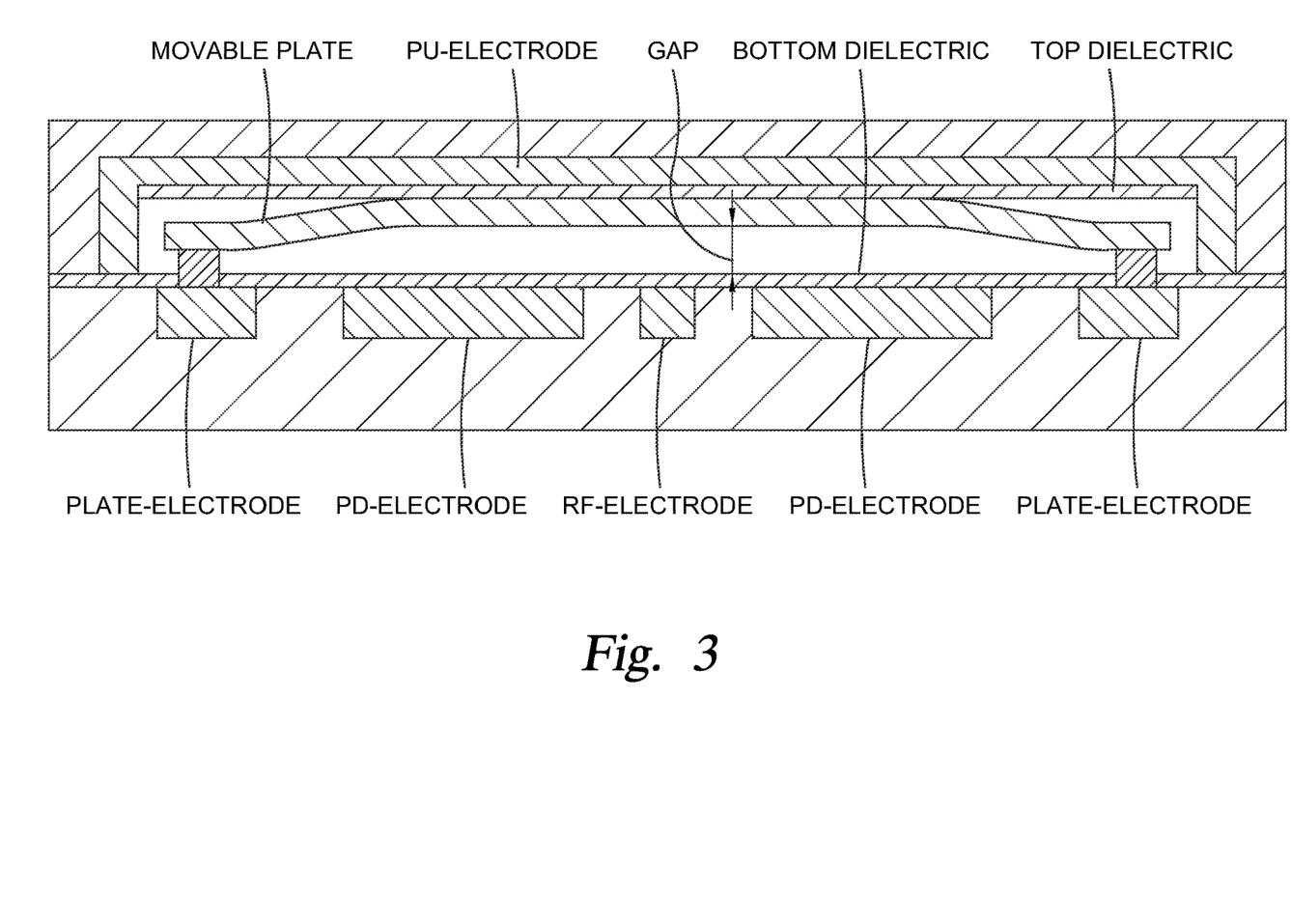
FIG. 3 is a schematic cross-section illustration of the MEMS DVC of FIG. 1 in the $C_{min}$ state.

MEMS DVCs are based on a moveable MEMS plate with a control-electrode above (i.e., pull-up electrode, pull-off electrode or PU-electrode) and below (i.e., a pull-in electrode, pull-down electrode or PD-electrode) the moveable MEMS plate, as shown schematically in FIG. 1. These electrodes are covered with a top and bottom dielectric layer. In addition there is an RF-electrode below the moveable MEMS element. Between the moveable plate and the RF-electrode there is a gap that is modulated by the voltages applied to either the PU or the PD-electrode with respect to the plate-electrode. These voltages result in electrostatic forces, which pull the MEMS element either up or down in contact to provide a stable minimum or maximum capacitance to the RF-electrode. In this way the capacitance from the moveable plate to the RF-electrode can be varied from a high capacitance state $C_{max}$ when pulled to the bottom (See FIG. 2) to a low capacitance state $C_{min}$ when pulled to the top (See FIG. 3).

Figure 4:
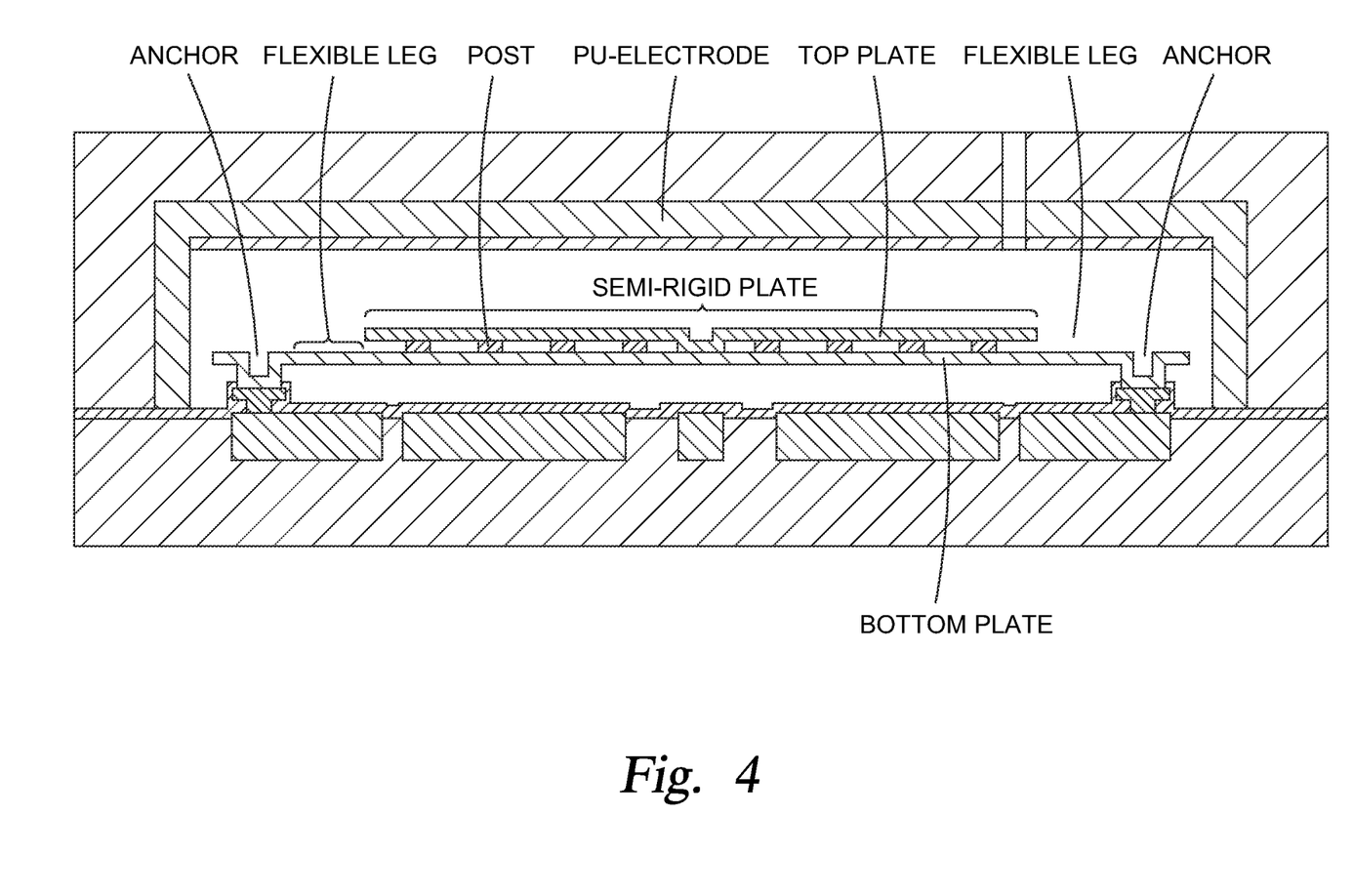
FIG. 4 is a detailed cross-section illustration of a MEMS DVC according to another embodiment.

FIG. 4 shows a more detailed cross-section view of a MEMS DVC device. The moveable plate consists of 2 plates (i.e., the bottom-plate and the top-plate) which are connected to each other via a plurality of posts. This combination of plates and posts creates a semi-rigid plate which is hard to bend. The plate is anchored to the substrate via a flexible leg-structure which allows relatively low operating voltages to operate the DVC device in the $C_{min}$ or the $C_{max}$ state.

When the lower plate is in contact with the dielectric layer overlying the RF electrode, the MEMS DVC is in the $C_{max}$ state. The distance between the lower plate and the RF electrode affects the capacitance. The RF electrode, if not substantially planar due to grain growth, negatively impacts the capacitance because asperites can form and cause an uneven topmost surface of the RF electrode, which in turn leads to an uneven dielectric layer formed thereover, which in turn leads to inconsistent capacitance in the $C_{max}$ state.

Therefore, there is a need in the art for a MEMS DVC and a method for manufacture that ensures a consistent capacitance.

SUMMARY OF THE INVENTION

The present invention generally relates to an RF MEMS DVC and a method for manufacture thereof. To ensure that undesired grain growth does not occur and contribute to an uneven RF electrode, a multilayer stack comprising an AlCu layer and a layer containing titanium may be used. The titanium diffuses into the AlCu layer at higher temperatures such that the grain growth of the AlCu will be inhibited and the switching element can be fabricated with a consistent structure, which leads to a consistent, predictable capacitance during operation.

In one embodiment, a MEMS DVC comprises at least one electrode; and a switching element movable from a first position spaced a first distance from the at least one electrode and a second position spaced a second distance from the at least one electrode, the at least one electrode comprising a multilayer stack of materials comprising at least one layer of AlCu having at least one layer containing titanium disposed thereon.

In another embodiment, a MEMS DVC comprises a substrate having a first electrode, a second electrode and an RF electrode disposed therein; a first dielectric layer disposed over the second electrode and the RF electrode; and a switching element coupled to the first electrode and movable from a first position spaced from the first dielectric layer and a second position in contact with the first dielectric layer. The RF electrode comprises a multilayer stack comprising an AlCu layer and a titanium containing layer disposed thereon.

In another embodiment, a method of manufacturing a MEMS DVC comprises forming an electrode comprising a multilayer stack of AlCu with a titanium containing layer thereon; and diffusing the titanium into the AlCu.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to an RF MEMS DVC and a method for manufacture thereof. To ensure that undesired grain growth does not occur and contribute to an uneven RF electrode, a multilayer stack comprising an AlCu layer and a layer containing titanium may be used. The titanium diffuses into the AlCu layer at higher temperatures such that the grain growth of the AlCu will be inhibited and the switching element can be fabricated with a consistent structure, which leads to a consistent, predictable capacitance during operation.

RF-MEMS require low parasitic to function properly. This can be achieved by using interconnect layers having low resistance like aluminum-based or copper-based materials. However, both materials have a tendency to grow during subsequent processing, especially when processing is performed at, or above the aluminum deposition temperature. This, in turn, yields a bottom electrode having a non-uniform topography.

By minimizing metal line grain growth of the capacitive section of the device, the beam will land flatter on the dielectric layer overlying the RF electrode and the beam will be more uniform over the length of the beam which will yield MEMS DVCs with higher, more consistent and more uniform capacitance.

Grain growth can be minimized by design-based or material-based solution. In one embodiment, the width of the plate may be narrowed. In one embodiment, the width of the plate may be controlled. In another embodiment, the area of the metallization layer can be decreased. In another embodiment, the aluminum thickness can be decreased. In still another embodiment, any titanium nitride deposited over the aluminum can be increased. Material-based or process-based embodiments are also contemplated. For example, aluminum can be deposited at a higher temperature so that the grain grown of aluminum in future processes will be minimal. Aluminum alloys, such as alloys containing a 'grain refiner' to prohibit aluminum grain growth may be used. Additionally, a multilayer stack can be used for the plates.

Figure 5A:
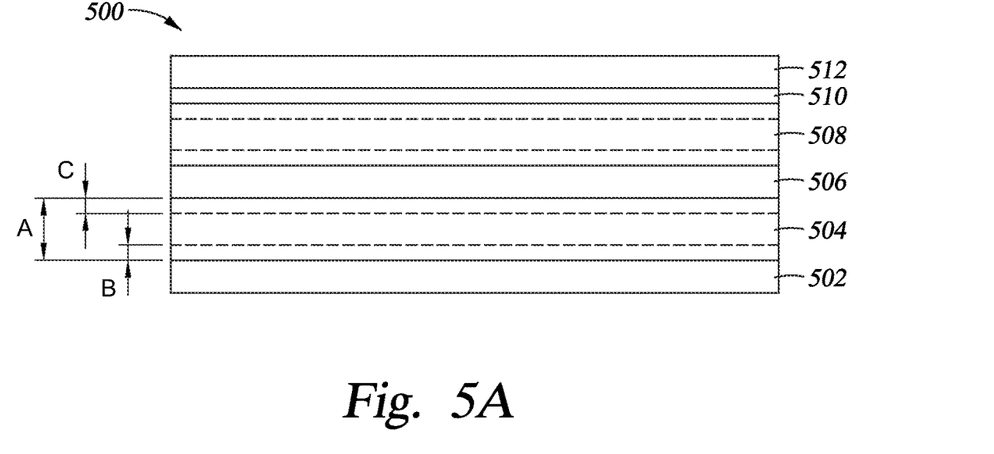
FIGS. 5A and 5B are schematic cross-sectional illustrations of bottom electrode plates according to various embodiments.
Figure 5B:
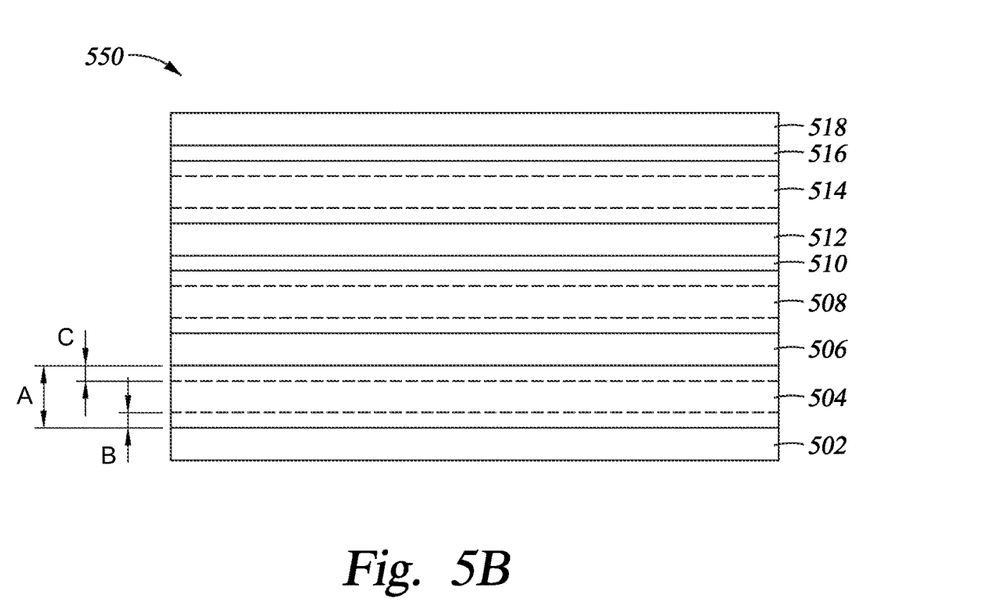

FIGS. 5A and 5B are schematic cross-sectional illustrations of electrodes according to various embodiments. The electrodes shown in FIGS. 5A and 5B can correspond to any or all of the electrodes shown in FIG. 4, namely the RF electrode, the PD-electrodes or the Plate electrodes. As shown in FIG. 5A, the electrode 500 may have a bottom layer 502. The bottom layer 502 may comprise a titanium containing material such as titanium or titanium nitride or a multi-layer structure such as a titanium seed layer (such as a layer having a thickness of between about 20 nm and about 50 nm) with a titanium nitride layer formed thereon. On layer 502, layer 504 may be deposited that contains aluminum, copper, aluminum-copper and alloys thereof. The layer 504 may have a thickness shown by arrows "A" of between about 300 nm and about 450 nm. Another layer 506 may be deposited on layer 504. Similar to layer 502, layer 506 may comprise a titanium containing material such as titanium or titanium nitride or a multi-layer structure such as a titanium seed layer (such as a layer having a thickness of between about 20 nm and about 50 nm) with a titanium nitride layer formed thereon.

The dashed lines shown in FIG. 5A show how far the titanium penetrates into layer 504. Arrows "B" and "C" show how the thickness of layer 504 containing the titanium that diffused into layer 504 from layers 502 and 506 respectively. In one embodiment, the titanium may diffuse into layer 504 a distance of between about 30 nm and about 60 nm from each layer 502, 506 so that any grain growth from layer 504 is significantly suppressed because the titanium containing layer, together with the titanium diffused into layer 504, suppress grain growth in layer 504. Thus, the grain growth in layer 504, which can occur at elevated temperatures in later processing, is suppressed or limited and has a minimal detrimental effect on the uniformity of the plate.

On layer 506, another layer 508 is deposited that contains aluminum, copper, aluminum-copper and alloys thereof. The layer 508 may have a thickness similar to layer 504. Another layer 510 may be deposited on layer 508 which may comprise a titanium containing material such as titanium as a seed layer followed by topmost layer 512 which may comprise titanium nitride whereby layer 510 has a thickness of between about 20 nm and about 50 nm) and layer 512 has a thickness of between about 400 nm and about 600 nm. Layer 512, due to the presence of titanium in the titanium nitride, will reduce any grain growth in the electrode 500. Similar to layer 504, the titanium from the adjacent layers 510 and 506 may diffuse into layer 508 as shown by the dashed lines.

It is to be understood that electrode 500 is one exemplified embodiment of an electrode and other embodiments are contemplated. Additionally, the layers in the electrode 500 are all conductive and are not limited to the materials described herein. It is contemplated that other conductive materials may be used and that if any layer has a tendency to have grain growth during device manufacture or operation (which would lead to non-uniformity of the plate), a grain growth inhibitor material may be used in the adjacent layer to prevent/limit grain growth. Additionally, electrode 500 is understood to be the RF electrode, the PD-electrodes or the Plate electrodes of FIG. 4. The electrode 500 may be formed by a blanket deposition method, such as sputtering, followed by a patterning process such as photolithography and etching.

FIG. 5B shows an embodiment of an electrode 550 according to another embodiment. As shown in FIG. 5B, additional layers 514, 516 and 518 have been deposited on layer 512. However, in the embodiment shown in FIG. 5B, layer 512 is not the topmost layer. Rather, layer 512 is in the middle of the electrode 550 and hence, is similar to layer 506. Layer 512 may comprise a titanium containing material such as titanium or titanium nitride or a multi-layer structure such as a titanium seed layer (such as a layer having a thickness of between about 20 nm and about 50 nm) with a titanium nitride layer formed thereon. Layer 514 may comprise aluminum, copper, aluminum-copper and alloys thereof and be similar to layers 504 and 508 in both composition and thickness. Layer 516 may be deposited on layer 514 which may comprise a titanium containing material such as titanium as a seed layer followed by layer 518 which may comprise a titanium containing material such as titanium nitride whereby layer 516 has a thickness of between about 20 nm and about 50 nm) and layer 518 has a thickness of between about 400 nm and about 600 nm. Similar to layers 504 and 508, the titanium from the adjacent layers 516 and 512 may diffuse into layer 514 as shown by the dashed lines.

It is to be understood that electrode 550 is another exemplified embodiment of an electrode and other embodiments are contemplated. Additionally, the layers in the electrode 550 are all conductive and are not limited to the materials described herein. It is contemplated that other conductive materials may be used and that if any layer has a tendency to have grain growth during device manufacture or operation (which would lead to non-uniformity of the plate), a grain growth inhibitor material may be used in the adjacent layer to prevent/limit grain growth. Additionally, electrode 550 is understood to be the RF electrode, the PD-electrodes or the Plate electrodes shown in FIG. 4. The electrode 550 may be formed by a blanket deposition method, such as sputtering, followed by a patterning process such as photolithography and etching.

Figure 6:
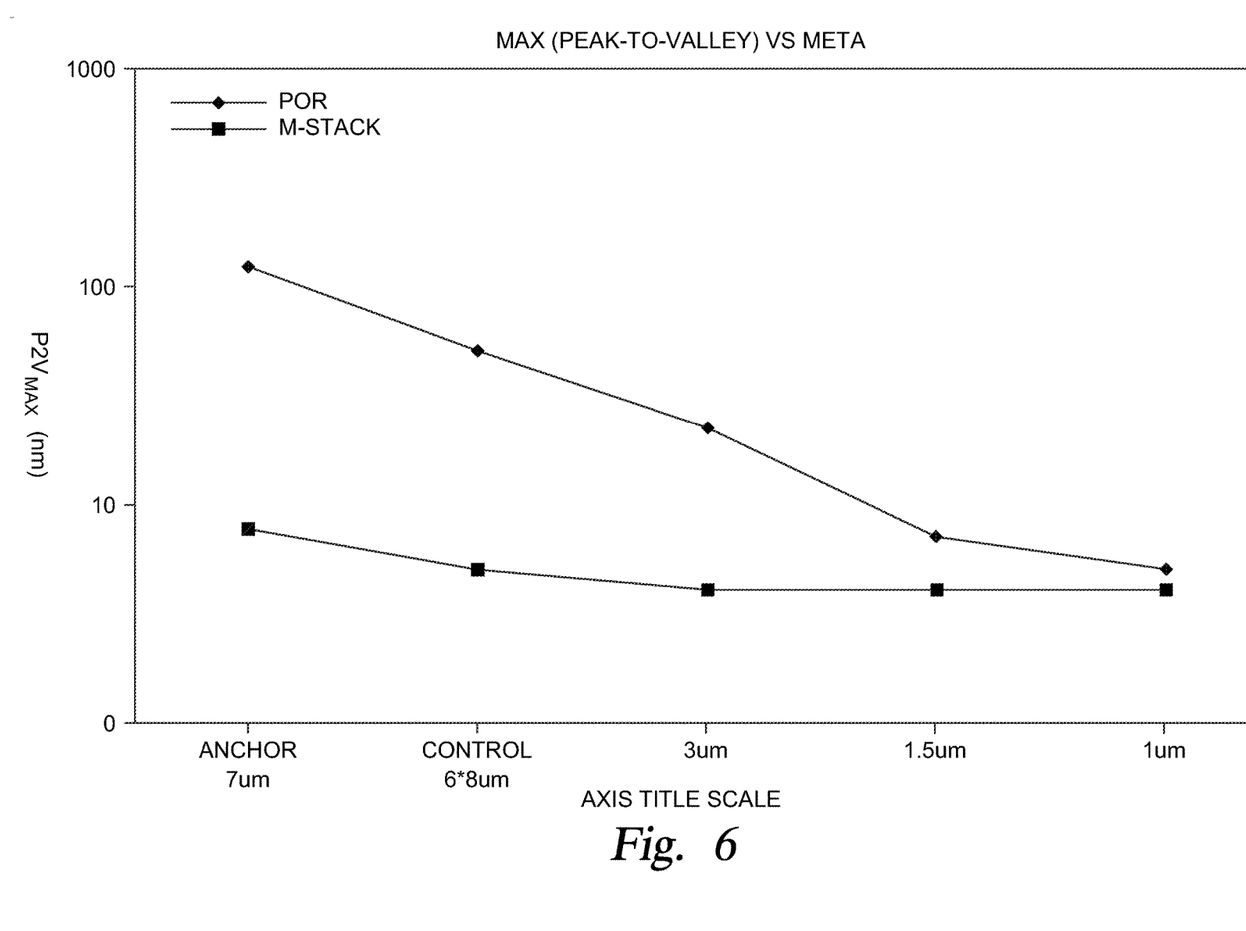
FIG. 6 is a graph showing the peak to valley height for various plates.

FIG. 6 is a graph showing the peak to valley height for various plates configurations. The Y-axis shows the highest peak-to-valley height measured on a given sample: it is labeled P2Vmax and its unit is nm. The X-axis shows various electrode configurations: they are ordered by increasing width and the width unit is um. It has been found that Peak-to-Valley height increases with increasing width. A standard Metallization scheme will lead to a dramatic increase in peak-to-valley height with increasing electrode width while a Multi Stack layer approach leads to a lower peak-to-valley height with no increase over a 1 to 3 um width range and a very moderate one in the 3 to 8 um width range. Bottom electrode is more planar and remains much more planar and consistent no matter the electrode design.

By using a multilayer stack for any of the electrodes in the MEMS DVC, grain growth may be suppressed. Suppressed grain growth leads to uniform plates and devices with higher and more uniform capacitance.

While the foregoing is directed to embodiments of the present invention, other and further embodiments of the invention may be devised without departing from the basic scope thereof, and the scope thereof is determined by the claims that follow.

The invention claimed is:

1. A MEMS DVC, comprising:
   at least one electrode; and
   a switching element movable from a first position spaced a first distance from the at least one electrode and a second position spaced a second distance from the at least one electrode, the at least one electrode comprising a multilayer stack of materials comprising a first layer containing titanium, the first layer containing titanium comprising a first multilayer structure comprising titanium and titanium nitride disposed on the titanium, a first layer of AlCu, a second layer containing titanium, the second layer containing titanium comprising a second multilayer structure comprising titanium and titanium nitride disposed on the titanium, a second layer of AlCu, and a third layer containing titanium, wherein at least one of the first layer containing titanium or the second layer containing titanium is disposed between the first layer of AlCu and the second layer of AlCu, and wherein the third layer containing titanium comprises a layer of titanium having a first thickness and a layer of titanium nitride disposed on the layer of titanium, wherein the layer of titanium nitride has a second thickness different than the first thickness.

2. The MEMS DVC of claim 1, further comprising:
   a third layer of AlCu; and
   a fourth layer containing titanium.

3. The MEMS DVC of claim 2, wherein the fourth layer containing titanium comprises titanium nitride.

4. The MEMS DVC of claim 1, wherein the first layer of AlCu has titanium diffused at least partially therein from an adjacent layer containing titanium.

5. The MEMS DVC of claim 1, wherein the titanium of the first layer comprising the first multilayer structure has a thickness between about 20 nm and 50 nm.

6. The MEMS DVC of claim 1, wherein the titanium of the first layer comprising the first multilayer structure has a thickness between about 20 nm and 50 nm.

7. The MEMS DVC of claim 1, further comprising:
   a third layer of AlCu; and
   a fourth layer containing titanium, the fourth layer containing titanium comprising a fourth multilayer structure containing titanium and titanium nitride disposed on the titanium.

8. The MEMS DVC of claim 7, wherein the titanium of the fourth layer containing titanium has thickness between about 20 nm and 50 nm.

9. A MEMS DVC, comprising:
   a substrate having a first electrode, a second electrode and an RF electrode disposed therein, wherein one or more of the first electrode, second electrode and RF electrode comprises a multilayer stack of materials comprising a first layer containing titanium, the first layer containing titanium comprising a first multilayer structure comprising titanium and titanium nitride disposed on the titanium, a first layer of AlCu, a second layer containing titanium, the second layer containing titanium comprising a second multilayer structure comprising titanium and titanium nitride disposed on the titanium, a second layer of AlCu, and a third layer containing titanium, wherein the second layer containing titanium is disposed between the first AlCu layer and the second AlCu layer, and wherein the third layer containing titanium comprises a layer of titanium having a first thickness and a layer of titanium nitride disposed on the layer of titanium, wherein the layer of titanium nitride has a second thickness different than the first thickness;
   a first dielectric layer disposed over the second electrode and the RF electrode; and
   a switching element coupled to the first electrode and movable from a first position spaced from the first dielectric layer and a second position in contact with the first dielectric layer.

10. The MEMS DVC of claim 9, further comprising:
    a third layer of AlCu; and
    a fourth layer containing titanium.

11. The MEMS DVC of claim 10, wherein the fourth layer containing titanium comprises titanium nitride.

12. The MEMS DVC of claim 9, wherein the first layer of AlCu has titanium diffused at least partially therein from an adjacent layer containing titanium.

13. The MEMS DVC of claim 9, wherein the titanium of the first layer containing titanium has a thickness between about 20 nm and 50 nm.

14. The MEMS DVC of claim 9, wherein the titanium of the first layer containing titanium has a thickness between about 20 nm and 50 nm.

15. The MEMS DVC of claim 9, further comprising:
    a third layer of AlCu; and
    a fourth layer containing titanium, the fourth layer containing titanium comprising a fourth multilayer structure comprising titanium and titanium nitride disposed on the titanium.

16. The MEMS DVC of claim 15, wherein the titanium of the fourth layer containing titanium has a thickness between about 20 nm and 50 nm.

* * * * *